(12) United States Patent
Wu et al.

(10) Patent No.: US 9,178,103 B2
(45) Date of Patent: Nov. 3, 2015

(54) APPARATUS AND METHOD FOR FORMING CHALCOGENIDE SEMICONDUCTOR ABSORBER MATERIALS WITH SODIUM IMPURITIES

(71) Applicant: TSMC Solar Ltd., Taichung (TW)

(72) Inventors: Chung-Hsien Wu, Luzhu Township (TW); Wen-Tsai Yen, Caotun Township (TW); Jyh-Lih Wu, Tainan (TW)

(73) Assignee: TSMC Solar Ltd., Taichung (TW)

( * ) Notice: Subject to any disclaimer, the term of this patent is extended or adjusted under 35 U.S.C. 154(b) by 69 days.

(21) Appl. No.: 13/962,979

(22) Filed: Aug. 9, 2013

(65) Prior Publication Data
US 2015/0044814 A1    Feb. 12, 2015

(51) Int. Cl.
*H01L 31/0392* (2006.01)
*H01L 31/18* (2006.01)
*C23C 12/00* (2006.01)

(52) U.S. Cl.
CPC ............... *H01L 31/18* (2013.01); *C23C 12/00* (2013.01); *H01L 31/03923* (2013.01)

(58) Field of Classification Search
CPC ................ H01L 21/02518; H01L 31/0264
See application file for complete search history.

(56) References Cited

U.S. PATENT DOCUMENTS

2012/0258567 A1* 10/2012 Aksu et al. ............... 438/95

OTHER PUBLICATIONS

Rudmann, D., "Effects of sodium on growth and properties of Cu(In,Ga)Se2 thin films and solar cells", A dissertation submitted to the Swiss Federal Institute of Technology (ETH) Zurich, 2004, DISS. ETH Nr. 15 576, 199 pages.

* cited by examiner

*Primary Examiner* — Cheung Lee
(74) *Attorney, Agent, or Firm* — Duane Morris LLP

(57) ABSTRACT

A method and system for forming chalcogenide semiconductor absorber materials with sodium impurities is provided. The system includes a sodium vaporizer in which a solid sodium source material is vaporized. The sodium vapor is added to reactant gases and/or annealing gases and directed to a furnace that includes a substrate with a metal precursor material. The precursor material reacts with reactant gases such as S-containing gases and Se-containing gases according to various process sequences. In one embodiment, a selenization operation is followed by an annealing operation and a sulfurization operation and the sodium vapor is caused to react with the metal precursor during at least one of the annealing and the sulfurization steps to produce a chalcogenide semiconductor absorber material that includes sodium dopant impurities.

20 Claims, 4 Drawing Sheets

APPARATUS AND METHOD FOR FORMING CHALCOGENIDE SEMICONDUCTOR ABSORBER MATERIALS WITH SODIUM IMPURITIES

TECHNICAL FIELD

The disclosure relates, most generally, to the formation of thin films. More particularly, the disclosure relates to producing and using a sodium vapor to form chalcogenide semiconductor materials doped with sodium. The chalcogenide semiconductor materials find application in solar cells and in various other applications.

BACKGROUND

Chalcogenide semiconductor materials are used in many applications and their popularity is increasing in recent years. A chalcogenide is a binary compound of a chalcogen and a more electropositive element or radical. Chalcogens are the group XVI elements of the periodic table: oxygen, sulfur, selenium, tellurium, and polonium. One particularly popular chalcogenide semiconductor material is CIGS, copper indium gallium selenide. CIGS materials find use in various applications and are particularly popular as absorber layers for solar cells. Due to the growing demand for clean sources of energy, the manufacture of solar cells has expanded dramatically in recent years, increasing the demand for CIGS and other chalcogenide materials. CIGS is a tetrahedrally bonded semiconductor, with a chalcopyrite crystal structure. In addition to the CIGS, copper indium gallium selenide chalcogenide discussed supra, other chalcogenide semiconductor materials include $CuInSe_2$, $CuGaSe_2$, and indium. The aforementioned and other chalcogenide semiconductor materials such as CIGSS, copper indium gallium sulfur-selenide, are semiconductors with a chalcopyrite structure and are therefore often referred to as chalcopyrite-based semiconductor materials or chalcopyrite-structured semiconductor materials. Other chalcogenide materials may also include chalcopyrite crystal structures.

Solar cells are photovoltaic components that provide for the direct generation of electrical current from sunlight. The absorber layer that absorbs the sunlight that will be converted into electrical current, is therefore of paramount importance. The formation of the absorber layer, the composition of the absorber layer and the placement of the same on a solar cell substrate are therefore each critical matters. The demand for the efficient, accurate and reliable production of an efficient absorber film is of growing and critical importance.

It would therefore be desirable to produce a high quality chalcogenide film with superior absorber qualities, using a method and system that produces smooth and uniform deposited chalcogenide films that are defect free and efficient absorbers.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The disclosure provides for forming chalcogenide semiconductor absorber materials with sodium dopant impurities. In many embodiments, the chalcogenide semiconductor absorber materials are used in solar cells. In one embodiment, the chalcogenide semiconductor material is CIGS, copper indium gallium selenide, and in another embodiment, the chalcogenide semiconductor material is CIGSS, copper indium gallium sulfur-selenide.

Sodium doping has been found to be helpful in improving solar cell performance in chalcogenide semiconductor materials such as CIGS and CIGSS. Sodium acts as an acceptor impurity that enhances p-type carrier concentration and eliminates defects particularly at grain boundaries.

The disclosure provides a method that includes forming metal precursors on a substrate such as a solar cell substrate, then directing reactive gases to a furnace in which the substrate with metal precursors is contained. The reactive gases react with the metal precursors to produce chalcogenide semiconductor materials for use as absorber layers. In some embodiments, the reactive gases include selenium containing gases and in some embodiments, the reactive gases include sulfur containing gases. In some embodiments, a selenization step precedes a sulfurization step and in some embodiments, the sulfurization step follows an annealing step which follows the selenization step. Various different process sequences are used.

The disclosure provides for vaporizing sodium by heating a solid sodium source and adding the sodium vapor to the reactant gases to form chalcogenide semiconductor absorber layers such as a CIGS or CIGSS film that includes sodium impurities. In some embodiments, the sodium impurities are present at about 0.1 to 1.0 atomic percent but other impurity concentrations are used in other embodiments.

Figure 1:
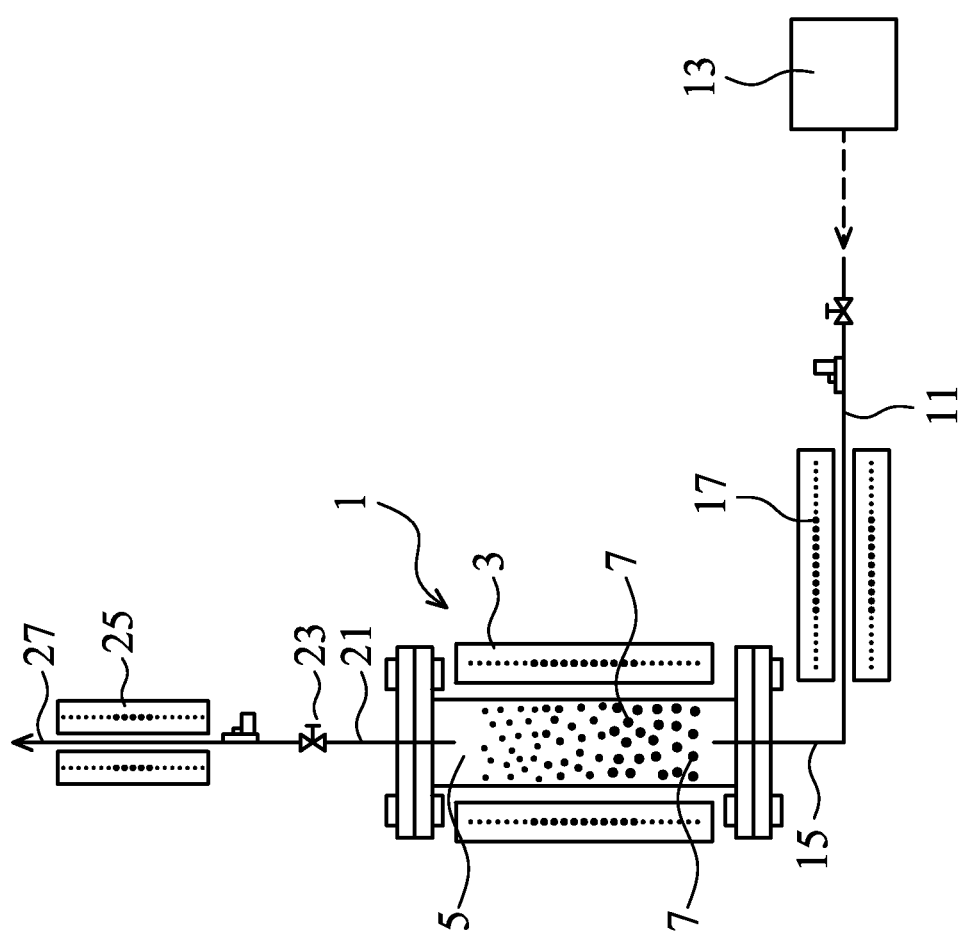
FIG. 1 is a schematic and view of a sodium vaporizing furnace with some components shown in cross-section.
Figure 2:
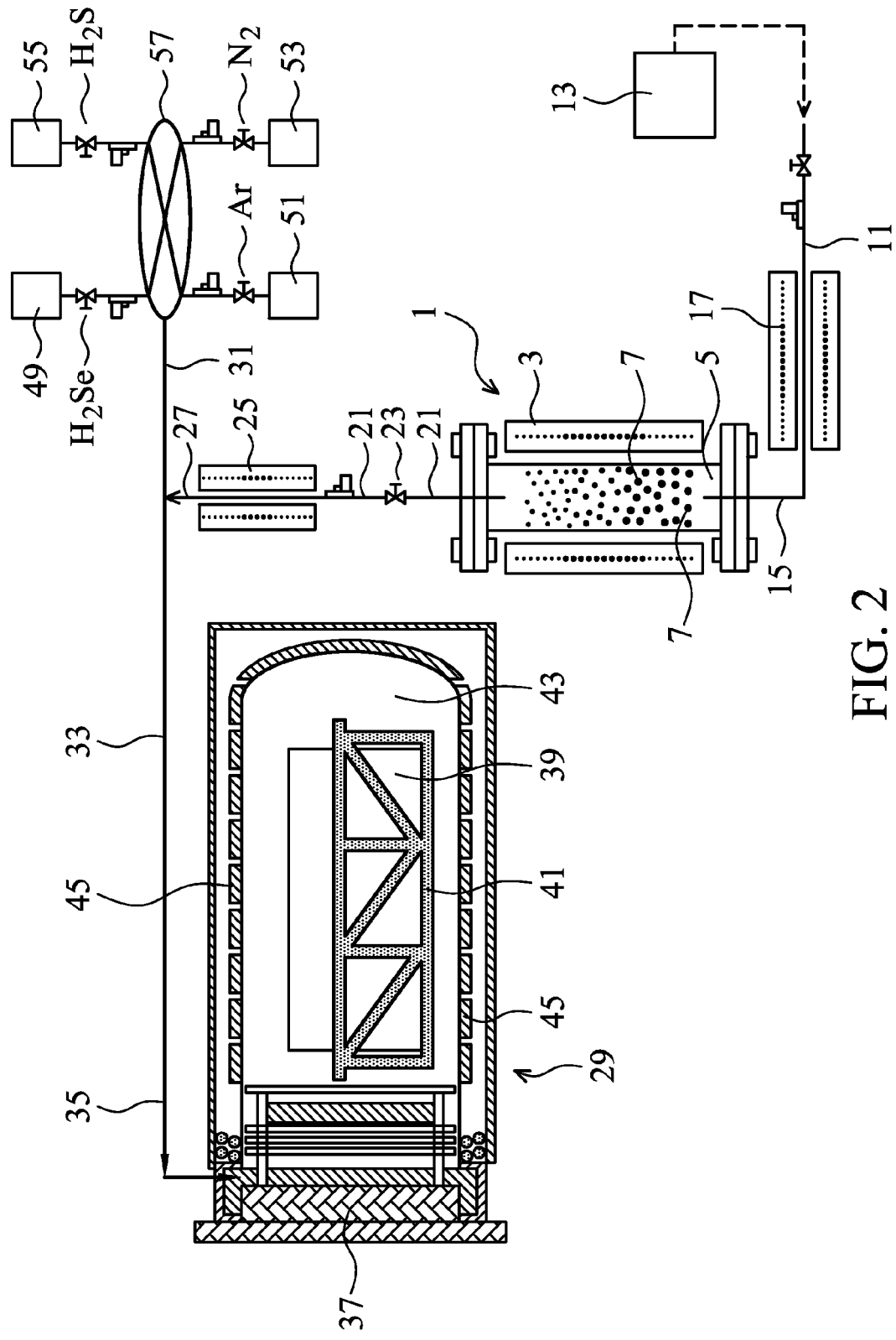
FIG. 2 is a schematic view showing a system for forming chalcogenide semiconductor absorber materials with some components shown in cross-section, including the sodium vaporizing furnace of FIG. 1.

FIG. 1 is a schematic view showing a system for vaporizing sodium and delivering sodium vapor. FIG. 1 includes side and cross-sectional views of some components. Sodium furnace 1 includes heater shield 3 disposed around the furnace which includes chamber 5. Within chamber 5 is solid sodium source material 7. Carrier gas 11 is delivered from carrier gas source 13 and flows through carrier gas line 15. Carrier gas line 15 includes preheater 17. Carrier gas 11 is $N_2$ or Ar in some embodiments and carrier gas 11 is $H_2S$ or $H_2Se$ in other embodiments. Preheater 17 heats carrier gas 11 to various temperatures in various embodiments. In one embodiment, preheater 17 heats carrier gas 11 to a temperature of about 400° C. or higher but other temperatures are used in other embodiments. Carrier gas 11 is delivered to chamber 5 and heater shield 3 heats and vaporizes solid sodium source material 7 within chamber 5. The vaporization temperature within chamber 5 is at least about 400° in one embodiment but other temperatures are used in other embodiments. Heater shield 3 includes a heating element and is used to heat sodium furnace 1 and thereby vaporize sodium source material 7. Various solid sodium source materials are used and include but are not limited to NaF, NaCl, $NaNO_3$, $Na_2SeO_3$, $Na_2S$ and $Na_2Se$. Other materials are used as solid sodium source material 7 in other embodiments. The heating of solid sodium source material 7, in combination with carrier gas 11, produces a stream of sodium vapor 27 in sodium vapor gas line 21. Valve 23 controls the gas flow of sodium vapor 27 in sodium vapor gas line 21 which serves as a conduit. In some embodiments, downstream heater 25 heats sodium vapor 27 within sodium vapor gas line 21 to prevent condensation of sodium vapor 27. FIG. 2 will show that sodium vapor 27 is combined with a reactant gas and delivered along with the reactant gas to a reaction furnace, in some embodiments.

In one embodiment, sodium vapor 27 is $NaS_x$ such as in an embodiment in which $H_2S$ is used as carrier gas 11 and the $NaS_x$ vapor is combined with inlet reaction gas 31 in a sulfurization operation within reaction chamber 43. In another embodiment, sodium vapor 27 is $NaSe_x$ vapor. In some embodiments, $NaSe_x$ vapor is produced using $H_2Se$ as carrier gas 11 and the $NaSe_x$ vapor is advantageously used in a selenization operation that takes place within reaction chamber 43.

FIG. 2 shows sodium furnace 1 such as was shown in FIG. 1. FIG. 2 also shows reaction furnace 29 within which a chalcogenide semiconductor absorbent material is formed on a substrate. FIG. 2 shows sodium vapor gas line 21 coupled to gas line 33 through which streams of inlet reaction gas 31 and gas mixture 35 flow. In some process steps of various embodiments, sodium vapor 27 is added to inlet reaction gas 31 to produce gas mixture 35 which is delivered to furnace 29. Gas mixture 35 is delivered to reaction furnace 29. Reaction furnace 29 is a programmable furnace capable of carrying out multiple in-situ processing operations in sequence and according to one embodiment, reaction furnace 29 carries out one or more chalcogenide semiconductor absorber material formation operations such as a selenization operation and a sulfurization operation. In some embodiments, the chalcogenide semiconductor absorber material formation operation includes a selenization reaction followed by a sulfurization reaction and in some embodiments, an annealing operation is carried out after either or both of the selenization and sulfurization steps. As such, various inlet reaction gases 31 are used. Inlet reaction gas 31 is delivered as part or all of gas mixture 35 to reaction furnace 29. In some embodiments, depending on the particular furnace operation being carried out in reaction furnace 29, inlet reaction gas 31 is combined with sodium vapor 27 to form gas mixture 35. In other operations, valve 23 turns off sodium vapor gas line 21 or sodium furnace 1 is non-operational and only inlet reaction gas 31 is delivered to reaction furnace 29.

Reaction furnace 29 includes door 37 for loading and unloading substrates such as substrate 39. Substrate 39 is retained by quartz boat 41 within reaction chamber 43. Heater shield 45 included a heating element and is used to heat reaction furnace 29 to various temperatures. Substrate 39 is a solar cell substrate in some embodiments. Substrate 39 is formed of glass, or suitable organic material such as polyimide, or metal foil in various embodiments. In other embodiments, quartz boat 41 is replaced by another suitable member for retaining substrate 39 within reaction chamber 43.

According to the methods of the disclosure, substrate 39 includes a metallic precursor material on its surface and a reaction takes place between at least inlet reaction gas 31 and the metal precursors on the surface of substrate 39, within reaction chamber 43 of reaction furnace 29. The disclosure provides for causing the reaction by heating reaction furnace 29 including substrate 39. In some embodiments, the metal precursor on substrate 39 is CuInGa but other precursor materials are used in other embodiments. In some embodiments, the reaction is a sulfurization operation using a S-containing reactive gas as inlet reaction gas 31 and in another embodiment, the reaction is a selenization operation using a Se-containing reactive gas as inlet reaction gas 31 but still other reactions and methods are performed in other embodiments. According to the embodiment in which the metal precursor on substrate 39 is CuInGa, in the selenization operation, the CuInGa precursor is converted to Cu(In,Ga)Se (CIGS) via a thermal selenization operation and in some embodiments, the selenization operation is followed by a sulfurization operation in which the selenized precursor material of CIGS is converted to Cu(In,Ga)SeS (CIGSS) via a thermal process, in which the CIGS reacts with a S-containing gas.

Inlet reaction gas 31 is composed of one or several gases from various gas sources. In the illustrated embodiment, gas sources 49, 51, 53 and 55 feed gas mixer 57. In the illustrated embodiment, gas source 49 is $H_2Se$, gas source 51 is Ar, gas source 53 is $N_2$ and gas source 55 is $H_2S$. Other gas sources are used in other embodiments. In one embodiment, reactant $H_2Se$ gas source 49 is combined with Ar gas source 51 in gas mixer 57 and delivered as inlet reaction gas 31 for a selenization operation carried out within reaction chamber 43. In one embodiment, $N_2$ gas source 53 and reactant $H_2S$ gas source 55 are combined in gas mixer 57 and delivered as inlet reaction gas 31 to reaction chamber 43 for a sulfurization reaction. For both the selenization operation and the sulfurization operation, different sources of selenium and sulfur are used in other embodiments and carrier gases other than argon and nitrogen are also used in other embodiments. In some embodiments, Ar gas source 51 or $N_2$ gas source 53 or other inert gases are delivered to reaction chamber 43 in an annealing operation.

Figure 3:
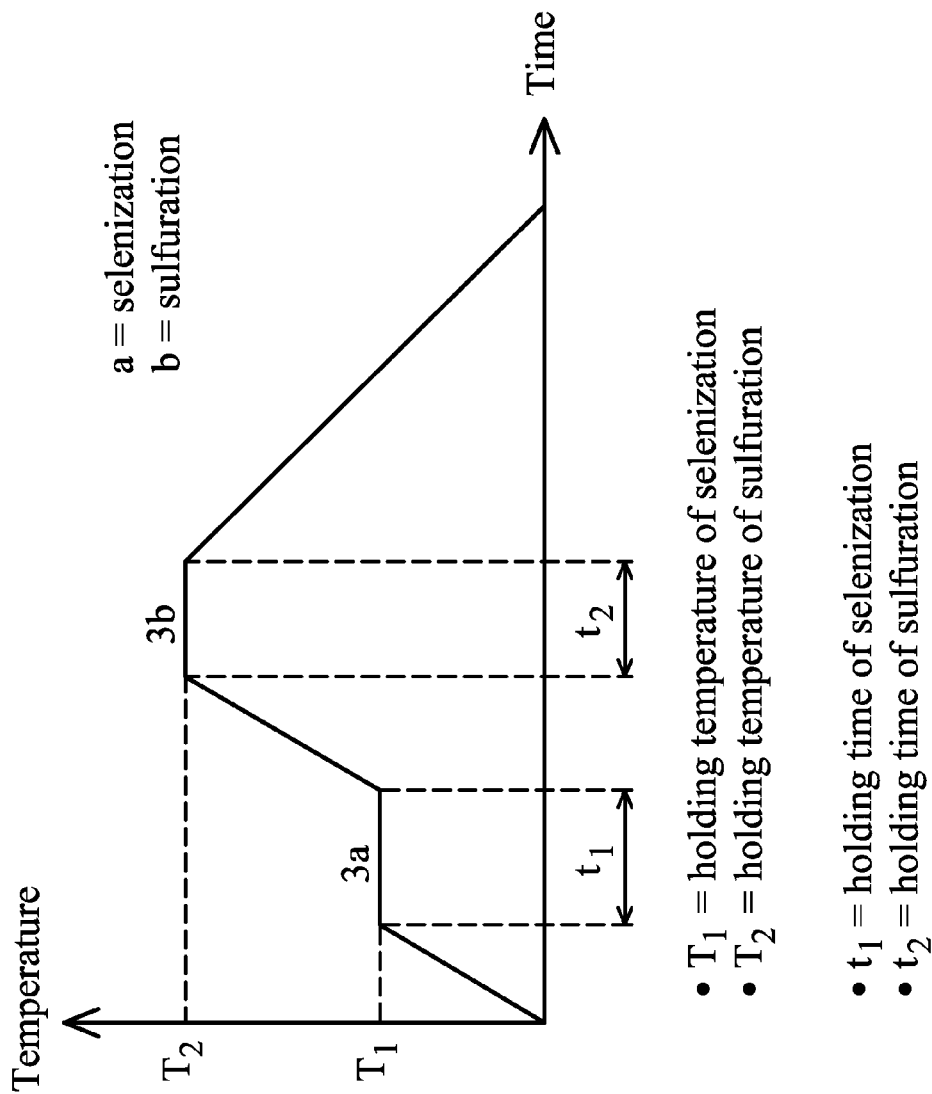
FIG. 3 is a graph showing a process profile for one embodiment of a method of the disclosure.
Figure 4:
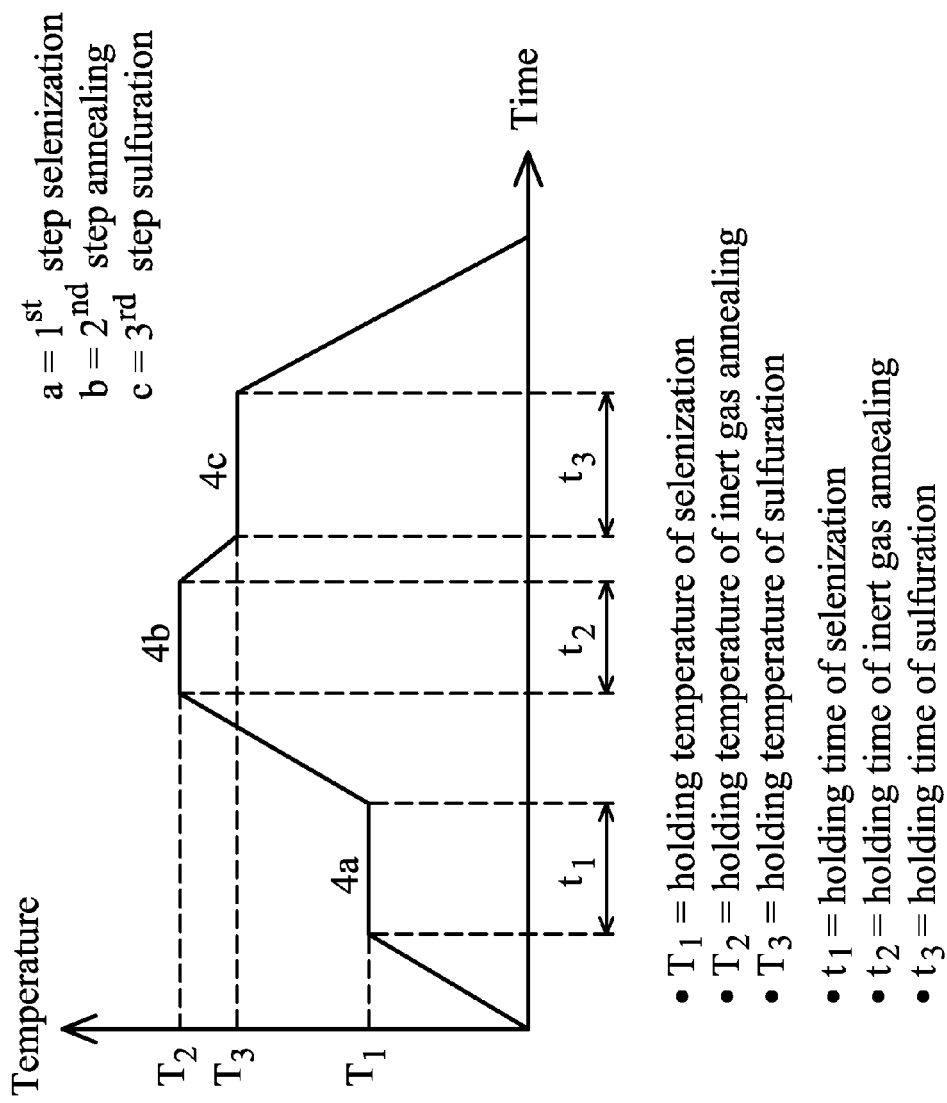
FIG. 4 is a graph showing a process profile for another embodiment of a method of the disclosure.

FIGS. 3 and 4 show two process profiles for embodiments of operations carried out according to the disclosure. FIG. 3 shows selenization step 3a followed by sulfurization step 3b. According to this embodiment, both selenization step 3a, sulfurization step 3b and also the temperature ramp up and ramp down steps are carried out within a furnace such as reaction furnace 29. Selenization step 3a includes the delivery of reactive Se-containing gases to reaction furnace 29 for reaction with metal precursors on the substrate and sulfurization step 3b includes the delivery of reactive S-containing gases to reaction furnace 29 for reaction with metal precursors on the substrate.

Sulfurization step 3b takes place at a higher temperature, $T_2$, than selenization step 3a according to the Temperature-time profile of FIG. 3. In one embodiment, temperature $T_2$ lies within the range of about 500-600° C. and temperature $T_1$ lies within a range of about 400-500° C. but other absolute and relative temperatures are used in other embodiments. The time, $t_1$ of selenization step 3a and the time, $t_2$ of sulfurization step 3b each lie within a range of about 10 minutes to 1 hour in some embodiments but other times are used in other embodiments. In FIG. 3, $t_2$ appears to be less than $t_1$ but in other embodiments, the times are the same and in still other embodiments, $t_1$ is less than $t_2$. According to one embodiment, no sodium vapor is used in the selenization step 3a reaction, and then in sulfurization step 3b, sodium vapor is added to the reaction. According to one embodiment, the addition of the sodium vapor at sulfurization step 3b, prevents problems associated with incorporating sodium too early into the formation of the chalcogenide material. One potential problem when sodium is added too early in the selenization, sulfurization sequence, is the incorporation of sodium along with Ga along the bottom of the chalcogenide material, i.e. at the interface between the chalcogenide material and the underlying material such as Mo.

FIG. 4 shows a Temperature-time process profile according to another process sequence embodiment of the disclosure. FIG. 4 shows selenization step 4a followed by annealing step 4b followed by sulfurization step 4c. The optional annealing step is carried out using any of various inert gases but in some embodiments (see below) a sodium vapor is also introduced during the annealing step 4b. According to one embodiment, temperature $T_1$ of selenization step 4a lies within the range of about 400-500° C., $T_2$ temperature during the annealing step 4b lies within a range of about 400-600° C. and $T_3$ used in sulfurization step 4c lies in the range of about 450-550° C. but other relative temperatures and other absolute temperatures are used in other embodiments. The times $t_1$, $t_2$, $t_3$ of the corresponding selenization step 4a, annealing step 4b, and sulfurization step 4c vary in various embodiments and each generally lie within a range of about 10 minutes to about 1 hour but other times and other relative times are used in other embodiments.

Still referring to FIG. 4, according to one embodiment, no sodium vapor is used in selenization step 4a but sodium vapor is used in either or both of annealing step 4b and sulfurization step 4c. In one embodiment, sodium vapor is used only in annealing step 4b, in an another embodiment, sodium vapor is used only in sulfurization step 4c and in yet another embodiment, sodium vapor is used both in annealing step 4b and sulfurization step 4c.

It should be understood that the profiles illustrated in FIGS. 3 and 4 represent various embodiments and are not limiting of the disclosure. According to another embodiment, the process sequence includes a selenization operation followed by a sulfurization operation followed by an annealing operation. According to this sequence, the sodium vapor is added and incorporated during either or both of the sulfurization operation and the annealing operation. According to this sequence, either of the sulfurization temperature or the annealing temperature may be the higher of the two temperatures.

According to the various embodiments in which sodium is introduced to the chalcogenide semiconductor material, various sodium vapor flow rates with various sodium vapor concentrations are used. The percentage of sodium vapor 27 within gas mixture 35 varies in various embodiments and is chosen to produce the desired overall sodium concentration and gradient of the sulfur impurity dopant profile, in the chalcogenide semiconductor material which is formed to various thicknesses and densities. In some embodiments, the overall sodium impurity concentration in the chalcogenide semiconductor material lies within a range of about 0.05 to about 1.0 at % but other percentages are used in other embodiments.

According to one aspect, a method for forming a chalcogenide semiconductor absorber material is provided. The method comprises: disposing a substrate with metallic precursors disposed thereon, in a furnace; vaporizing sodium to produce a sodium vapor; combining the sodium vapor with an inlet reaction gas stream to produce a gas mixture; delivering the gas mixture to the furnace; and causing the gas mixture to react with the metallic precursors in the furnace to form a chalcogenide semiconductor absorber material with sodium dopants therein.

In some embodiments, the vaporizing comprises heating a solid sodium source material to a temperature of at least about 400° C. and wherein the causing includes heating.

In some embodiments, the solid sodium source material comprises at least one of NaF, NaCl, $NaNO_3$, $Na_2SeO_3$, $Ns_2S$ and $Na_2Se$.

In some embodiments, the vaporizing includes directing a carrier gas to a vaporizer unit, the sodium vapor comprises a sodium vapor stream and the combining comprises adding the sodium vapor stream to the inlet reaction gas stream.

In some embodiments, the carrier gas comprises one of $H_2S$, $H_2Se$, $N_2$ and Ar.

In some embodiments, the inlet reaction gas stream includes $H_2S$ and the causing the gas mixture to react comprises causing a sulfurization reaction.

In some embodiments, the causing step includes heating and further comprising reacting the metallic precursors with selenium prior to the causing.

In some embodiments, the method further comprises reacting the metallic precursors with selenium prior to the causing.

In some embodiments, the method further comprises annealing with an inert annealing gas and the sodium vapor prior to the causing, using an annealing temperature higher than a temperature used in the causing.

In some embodiments, the method further comprises selenizing by reacting the metallic precursors with selenium prior to the causing, and annealing after the selenizing and prior to the causing, using an inert annealing gas and the sodium vapor.

According to another aspect, a method for forming a chalcogenide semiconductor absorber material is provided. The method comprises: disposing a substrate with metallic precursors thereon, in a furnace; vaporizing sodium to produce a sodium vapor; selenizing by causing thermal reaction between selenium and the metallic precursors in a selenization reaction in the furnace; sulfurizing by causing thermal reaction between sulfur and the metallic precursors in a sulfurization reaction in the furnace after the selenization reaction; and annealing after the selenization reaction, wherein at least one of the sulfurization reaction and the annealing includes causing the sodium vapor to react with the metallic precursors.

In some embodiments, the sulfurizing is carried out after the annealing and at a lower temperature than the annealing and the annealing is carried out at a higher temperature than the selenization reaction.

In some embodiments, the sulfurizing includes causing the sodium vapor to react with the metallic precursors by delivering a sulfur-containing gas mixture to the furnace and combining the sodium vapor with the sulfur-containing gas mixture.

In some embodiments, the annealing includes causing the sodium vapor to react with the metallic precursors by delivering the sodium vapor to the furnace during the annealing.

In some embodiments, the vaporizing step comprises heating a solid sodium source material, the solid sodium source material comprising at least one of NaF, NaCl, $NaNO_3$, $Na_2SeO_3$, $Ns_2S$ and $Na_2Se$.

In some embodiments, the vaporizing step includes directing a carrier gas to a vaporizer unit, the sodium vapor comprises a sodium vapor stream, at least one of the sulfurizing and the annealing includes delivering the sodium vapor stream to the furnace, wherein the carrier gas comprises one of $H_2S$, $H_2Se$, $N_2$ and Ar.

A system for forming a chalcogenide semiconductor absorber material doped with sodium is also provided. The system comprises: a furnace adapted to contain a substrate with metallic precursors thereon; a sodium vaporizer with solid sodium source material therein and including a heater capable of vaporizing the solid sodium source material to produce a sodium vapor; a reaction gas source; a conduit fluidly coupling the reaction gas source to the furnace; and a sodium vapor conduit fluidly coupling the sodium vaporizer to the conduit; wherein the conduit is adapted to deliver a mixture of the reaction gas and the sodium vapor to the furnace.

In some embodiments, the system further comprises a carrier gas source upstream from the sodium vaporizer and coupled to the sodium vaporizer by a carrier gas line, and a pre-heater adapted to heat the carrier gas line upstream from the vaporizer.

In some embodiments, the solid sodium source material comprises at least one of NaF, NaCl, NaNO$_3$, Na$_2$SeO$_3$, Ns$_2$S and Na$_2$Se.

In some embodiments, the system further comprises a heater adapted to heat the sodium vapor conduit fluidly downstream from the vaporizer.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for forming a chalcogenide semiconductor absorber material, said method comprising:
   disposing a substrate with metallic precursors thereon, in a furnace;
   vaporizing sodium to produce a sodium vapor;
   selenizing by causing thermal reaction between selenium and said metallic precursors in a selenization reaction in said furnace;
   sulfurizing by causing thermal reaction between sulfur and said metallic precursors in a sulfurization reaction in said furnace after said selenization reaction; and
   annealing after said selenization reaction,
   wherein at least one of said sulfurizing and said annealing includes causing said sodium vapor to react with said metallic precursors.

2. The method as in claim 1, wherein said sulfurizing is carried out after said annealing and at a lower temperature than said annealing and said annealing is carried out at a higher temperature than said selenization reaction.

3. The method as in claim 1, wherein said sulfurization includes causing said sodium vapor to react with said metallic precursors by delivering a sulfur-containing gas mixture and said sodium vapor, to said furnace.

4. The method as in claim 1, wherein said annealing includes causing said sodium vapor to react with said metallic precursors by delivering said sodium vapor to said furnace during said annealing.

5. The method as in claim 1, wherein said vaporizing comprises heating a solid sodium source material, said solid sodium source material comprising at least one of NaF, NaCl, NaNO$_3$, Na$_2$SeO$_3$, Ns$_2$S and Na$_2$Se.

6. The method as in claim 1, wherein said vaporizing includes directing a carrier gas to a vaporizer unit, said sodium vapor comprises a sodium vapor stream, at least one of said sulfurizing and said annealing includes delivering said sodium vapor stream to said furnace, wherein said carrier gas comprises one of H$_2$S, H$_2$Se, N$_2$ and Ar.

7. The method as in claim 6, wherein said carrier gas includes H$_2$S and said causing said sodium vapor to react causes the sulfurization reaction.

8. The method as in claim 1, wherein said causing said sodium vapor to react includes heating, and wherein the selenizing is performed prior to said causing said sodium vapor to react.

9. The method as in claim 1, wherein the selenizing is performed prior to said causing said sodium vapor to react.

10. The method as in claim 1, wherein the annealing is performed with an inert annealing gas and said sodium vapor prior to said causing said sodium vapor to react, using an annealing temperature higher than a temperature used in said causing said sodium vapor to react.

11. The method as in claim 1, wherein said annealing is performed using an inert annealing gas, prior to said causing said sodium vapor to react.

12. A method for forming a chalcogenide semiconductor absorber material, said method comprising:
    disposing a substrate with metallic precursors thereon, in a furnace;
    vaporizing sodium to produce a sodium vapor;
    selenizing by causing thermal reaction between selenium and said metallic precursors in a selenization reaction in said furnace;
    sulfurizing by causing thermal reaction between sulfur and said metallic precursors in a sulfurization reaction in said furnace after said selenization reaction, said sulfurizing step including causing said sodium vapor to react with said metallic precursors; and
    annealing after said selenization reaction.

13. The method as in claim 12, wherein said sulfurizing is carried out after said annealing and at a lower temperature than said annealing and said annealing is carried out at a higher temperature than said selenization reaction.

14. The method as in claim 12, wherein said sulfurization includes causing said sodium vapor to react with said metallic precursors by delivering a sulfur-containing gas mixture and said sodium vapor, to said furnace.

15. The method as in claim 12, wherein said vaporizing includes directing a carrier gas to a vaporizer unit, said sodium vapor comprises a sodium vapor stream, said sulfurizing includes delivering said sodium vapor stream to said furnace, wherein said carrier gas comprises one of $H_2S$, $H_2Se$, $N_2$ and Ar.

16. The method of claim 15, wherein said carrier gas comprises $H_2S$.

17. The method of claim 12, wherein said sulfurizing is performed after said annealing.

18. The method of claim 12, wherein said sulfurizing is performed at a lower temperature than said annealing.

19. The method of claim 12, wherein said annealing is performed at a higher temperature than said selenization reaction.

20. The method of claim 12, wherein said sulfurization includes delivering a sulfur-containing gas mixture and said sodium vapor to said furnace.

* * * * *